(12) United States Patent
Tung et al.

(10) Patent No.: US 11,729,947 B2
(45) Date of Patent: Aug. 15, 2023

(54) COOLING SYSTEM OF SERVER

(71) Applicants: Inventec (Pudong) Technology Corporation, Shanghai (CN); INVENTEC CORPORATION, Taipei (TW)

(72) Inventors: Kai-Yang Tung, Taipei (TW); Hung-Ju Chen, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 312 days.

(21) Appl. No.: 17/336,266

(22) Filed: Jun. 1, 2021

(65) Prior Publication Data
US 2022/0159872 A1 May 19, 2022

(30) Foreign Application Priority Data
Nov. 19, 2020 (CN) .......................... 202011302404.8

(51) Int. Cl.
*H05K 7/20* (2006.01)
(52) U.S. Cl.
CPC ..... *H05K 7/20281* (2013.01); *H05K 7/20236* (2013.01); *H05K 7/20272* (2013.01); *H05K 7/20763* (2013.01)

(58) Field of Classification Search
CPC ........... H05K 7/20281; H05K 7/20236; H05K 7/20272; H05K 7/20763; H05K 7/20327; H05K 7/208; G06F 1/20; G06F 2200/201
See application file for complete search history.

(56) References Cited

U.S. PATENT DOCUMENTS

| 2014/0218859 | A1* | 8/2014 | Shelnutt | H05K 7/20809 361/679.46 |
|---|---|---|---|---|
| 2015/0060009 | A1* | 3/2015 | Shelnutt | H05K 7/203 165/11.1 |
| 2021/0022263 | A1* | 1/2021 | Enright | B25J 9/026 |
| 2021/0148643 | A1* | 5/2021 | Tung | H01L 23/4332 |

* cited by examiner

*Primary Examiner* — Emmanuel E Duke
(74) *Attorney, Agent, or Firm* — CKC & Partners Co., LLC

(57) ABSTRACT

A cooling system of server includes a tank, a case body, a multi-hole box, a first dehumidifying material, a first tube, and a second tube. The tank is configured to accommodate a dielectric fluid. The multi-hole box is disposed in the case body. The first dehumidifying material is disposed in the multi-hole box. The first tube includes a first gas-inlet/outlet end and a second gas-inlet/outlet end respectively connected to the tank and the case body. The second gas-inlet/outlet end is connected to the first dehumidifying material. The second tube includes a liquid-inlet end and a liquid-outlet end respectively connected to the case body and the tank.

10 Claims, 4 Drawing Sheets

COOLING SYSTEM OF SERVER

CROSS-REFERENCE TO RELATED APPLICATION

This application claims priority to China Application Serial Number 202011302404.8, filed Nov. 19, 2020, the disclosures of which are incorporated herein by reference in their entireties.

BACKGROUND

Field of Invention

The present disclosure relates to a cooling system of a server. More particularly, the present disclosure relates to a single phase immersion cooling system.

Description of Related Art

The current single-phase immersion cooling system includes low-temperature liquid flowing into the tank from below, and the liquid is homogeneously distributed in the entire tank through a porous plate. The temperature of the liquid flowing through the electronic components (e.g., a server) will rise due to the waste heat generated by the electronic components. The high-temperature liquid flows out of the tank through the heat exchanger located on the upper portion of the tank and dissipates the heat out of the system through the heat exchanger, so that the temperature of the liquid is lowered and flows into the tank again. Since the tank is not vacuum and not completely sealed, there will be air in the tank. When the air is cooled, the water vapor contained therein will be condensed to form liquid water. When this liquid water is in contact with electronic components, it will cause damage.

The liquid used in the single-phase immersion cooling system is mainly divided into two categories, one is the traditionally used non-conductive oil liquid such as mineral oil, and the other is the fluorinated liquid that is more commonly used in recent new systems. Since the fluorinated liquid has low viscosity and a little volatility, after the server is taken out of the liquid tank, the amount of residual liquid on the surface is small. After being placed in a ventilated place for a period of time, the residual fluorinated liquid will evaporate. It is convenient for users to maintain the cooling system.

However, due to the higher cost of fluorinated liquids and its easier volatilization than oils, the requirements for system sealing and pressure control are also higher. In addition, because the fluorinated liquid has a higher density than liquid water, the condensed water will float above the fluorinated liquid tank. In order to avoid contact between condensed water and electronic components, a water removal device must be installed.

Therefore, how to propose a cooling system of a server that can solve the aforementioned problems is one of the problems that the industry urgently wants to invest in research and development resources to solve.

SUMMARY

In view of this, one purpose of present disclosure is to provide a cooling system of a server that can solve the aforementioned problems.

In order to achieve the above objective, according to one embodiment of the present disclosure, a cooling system of a server includes a tank, a case body, a multi-hole box, a first dehumidifying material, a first tube, and a second tube. The tank is configured to accommodate a dielectric fluid. The multi-hole box is disposed in the box body. The first dehumidifying material is disposed in the multi-hole box. The first tube includes a first gas-inlet/outlet end and a second gas-inlet/outlet end respectively connected to the tank and the case body. The second gas-inlet/outlet end is connected to the first dehumidifying material. The second tube includes a liquid-inlet end and a liquid-outlet end respectively connected to the case body and the tank.

In one or more embodiments of the present disclosure, the cooling system of the server further includes a third tube and a first valve. The third tube communicates with the space inside and outside the case body. The first valve is disposed on the third tube.

In one or more embodiments of the present disclosure, the cooling system of the server further includes a barometer and a controller. The barometer is configured to detect the air pressure value in the tank. The controller is configured to open the first valve when the air pressure value is higher than an upper limit value of air pressure, and is configured to close the first valve when the air pressure value is lower than the upper limit value of air pressure.

In one or more embodiments of the present disclosure, the controller is further configured to open the first valve when the air pressure value is lower than the lower limit value of air pressure.

In one or more embodiments of the present disclosure, the liquid inlet end and an end of the third tube connected to the case body are respectively located on opposite sides of the first dehumidifying material.

In one or more embodiments of the present disclosure, the cooling system of the server further includes a second valve. The second valve is disposed on the second tube.

In one or more embodiments of the present disclosure, the cooling system of the server further includes a liquid level sensor and a controller. The liquid level sensor is configured to detect a liquid level of a condensed liquid in the case body. The controller is configured to respectively open and close the second valve when the liquid level is higher than and lower than a preset value.

In one or more embodiments of the present disclosure, the cooling system of the server further includes a second dehumidifying material. The second dehumidifying material is disposed in the second tube.

In one or more embodiments of the present disclosure, the cooling system of the server further includes a second valve. The second valve is disposed on the second tube. The second valve and the second dehumidifying material are respectively adjacent to the liquid inlet end and the liquid outlet end.

In one or more embodiments of the present disclosure, the tank has a liquid side and a gas side opposite to each other, and the liquid outlet end and the first gas-inlet/outlet end are respectively adjacent to the liquid side and the gas side.

In summary, in the cooling system of the server of the present disclosure, the hot vapor in the tank caused by the electronic components that are immersed in the dielectric fluid to generate waste heat, and the wet air entering the cooling system of the server from the outside are absorbed with water vapor and/or liquid water through dehumidifying materials, so as to avoid contact between liquid water and electronic components in the cooling system of the server. Since the air entering and exiting the cooling system of the server is processed by dehumidifying materials, the cooling system of the server can be effectively maintained in a low humidity condition. In the cooling system of the server of the present disclosure, the user can control the opening and closing of the valve to achieve the purpose of maintaining the air pressure between the preset upper limit and lower limit and preventing the escape of dielectric fluid, so that the air pressure is constant and the recovery rate of the dielectric fluid is improved.

The above-mentioned description is only used to explain the problem to be solved by the present disclosure, the technical means to solve the problem, and the effects produced, etc. The specific details of the present disclosure will be well discussed in the following embodiments and related drawings.

BRIEF DESCRIPTION OF THE DRAWINGS

In order to make the above and other objectives, features, advantages and examples of the present disclosure more obvious, the description of the accompanying drawings is as follows.

DETAILED DESCRIPTION

Figure 1:
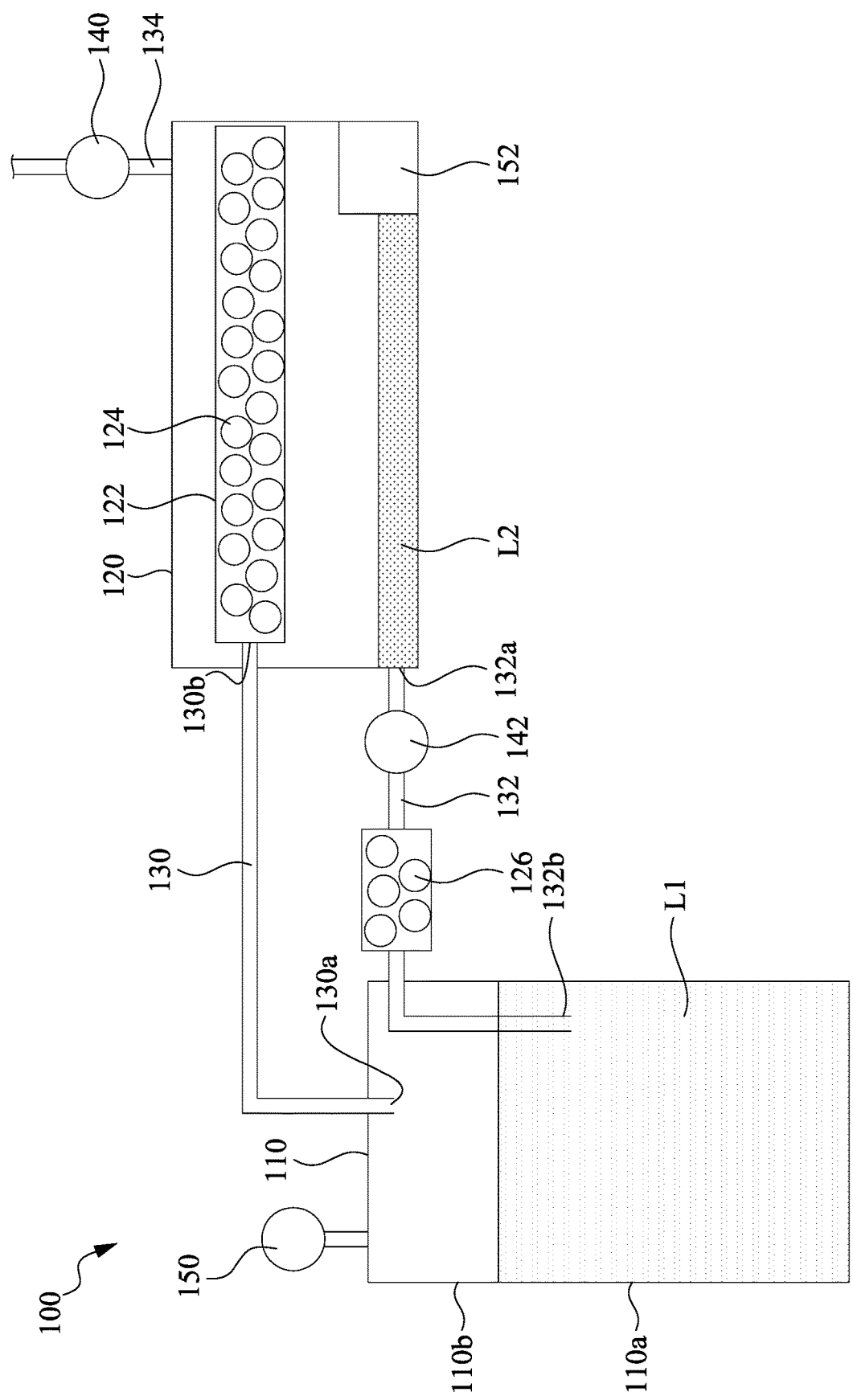
FIG. 1 shows a schematic view of a cooling system of a server, in accordance with an embodiment of present disclosure.

Hereinafter, a plurality of embodiments of the present disclosure will be disclosed in diagrams. For clarity of discussion, many details in practice will be described in the following description. However, it should be understood that these details in practice should not limit present disclosure. In other words, in some embodiments of present disclosure, these details in practice are unnecessary. In addition, for simplicity of the drawings, some conventionally used structures and elements will be shown in a simple schematic manner in the drawings. The same reference numbers are used in the drawings and the description to refer to the same or like parts.

Hereinafter, the structure and function of each component included in a cooling system 100 of a server of this embodiment and the connection relationship between the components will be described in detail.

As shown in FIG. 1, in this embodiment, the cooling system 100 of the server includes a tank 110, a case body 120, a first tube 130, and a second tube 132. The tank 110 has a liquid side 110a and a gas side 110b opposite to each other, and a dielectric liquid L1 loaded in the tank 110 is located on the liquid side 110a. A multi-hole box 122 is disposed in the case body 120. A first dehumidifying material 124 is disposed in the multi-hole box 122. The first dehumidifying material 124 is configured to absorb water, instead of absorbing the dielectric liquid L1 and the dielectric liquid vapor generated by the dielectric liquid L1. The first tube 130 has a first gas-inlet/outlet end 130a and a second gas-inlet/outlet end 130b respectively connected to the tank 110 and the case body 120. The second gas-inlet/outlet end 130b is connected to the first dehumidifying material 124. The second tube 132 has a liquid inlet end 132a and a liquid outlet end 132b respectively connected to the case body 120 and the tank 110. When the dielectric liquid L1 in the tank 110 generates dielectric liquid vapor (for example, due to the heating of electronic components), the mixed gas in the tank 110 will reach the first dehumidifying material 124 through the first tube 130 and the moisture in the mixed gas is absorbed. The dehumidified gas then enters the case body 120 and condenses the dielectric liquid L1 in the case body 120.

In this embodiment, the cooling system 100 of the server further includes a third tube 134. The third tube 134 communicates with the space inside and outside the case body 120. When the air pressure in the tank 110 is too high (for example, the air pressure in the tank 110 is greater than the upper limit value of air pressure), the cooling system 100 of the server can exhaust the air in the case body 120 through the third tube 134 to avoid excessive gas in the cooling system 100 of the server. When the air pressure in the tank 110 is too low (for example, the air pressure value of the tank 110 is lower than the lower limit value of air pressure), the cooling system 100 of the server can introduce the wet air from the outside into the case body 120 through the third tube 134, and the moisture is absorbed through the first dehumidifying material 124. The dehumidified dry air can then enter the tank 110 through the first tube 130 to avoid insufficient air in the cooling system 100 of the server. The dielectric liquid L1 obtained by condensing the air in the case body 120 and the liquid water will be mixed to form a condensed liquid L2. The condensed liquid L2 can flow into the tank 110 through the second tube 132, in which a second dehumidifying material 126 disposed in the second tube 132 first absorbs liquid water, and the residue dielectric liquid L1 then flows into the tank 110.

With the aforementioned structural configuration, the cooling system 100 of the server can achieve the effect of keeping the entire system in a dry condition through the moisture absorption of the first dehumidifying material 124 and the second dehumidifying material 126, and effectively avoid liquid water in contact with electronic components. In addition, since the dielectric liquid vapor generated by the dielectric liquid L1 in the tank 110 can be condensed in the case body 120 through the above-mentioned path and flow back to the tank 110 through the second tube 132, the escape of the dielectric liquid L1 therefore can be effectively reduced to increase the recovery rate of the dielectric fluid L1.

In some embodiments, the dielectric fluid L1 may be a dielectric substance such as oil or fluorinated fluid, but the present disclosure is not limited thereto.

In some embodiments, the case body 120 is disposed at a position higher than the liquid level of the dielectric fluid L1, so that the dielectric fluid L1 condensed in the case body 120 automatically flows back to the tank 110 based on its own gravity, but the present disclosure is not limited thereto.

In some embodiments, the first gas-inlet/outlet end 130a is connected to a sidewall of the gas side 110b of the tank 110. In some other embodiments, the first gas-inlet/outlet end 130a protrudes into the tank 110 through the sidewall of the gas side 110b, as shown in FIG. 1.

In some embodiments, the second gas-inlet/outlet end 130b is connected to a sidewall of the case body 120, as shown in FIG. 1. In some other embodiments, the second gas-inlet/outlet end 130b protrudes into the case body 120 through the sidewall of the case body 120.

In some embodiments, the first dehumidifying material 124 may be a molecular sieve, but the present disclosure is not limited thereto. In some embodiments, the first dehumidifying material 124 can be used with a humidity indicator, so that the user can instantly replace the first dehumidifying material 124 according to the humidity condition indicated by the humidity indicator.

In some embodiments, the second dehumidifying material 126 may be a molecular sieve, but the present disclosure is not limited thereto. In some embodiments, the second dehumidifying material 126 can be used with a humidity indicator, so that the user can instantly replace the second dehumidifying material 126 according to the humidity condition indicated by the humidity indicator.

In some embodiments, the liquid inlet end 132a of the second tube 132 is connected to the sidewall of the case body 120. In some other embodiments, the liquid inlet end 132a protrudes into the case body 120 through the sidewall of the case body 120, as shown in FIG. 1.

In some embodiments, the liquid outlet end 132b is connected to a sidewall of the liquid side 110a of the tank 110. In some other embodiments, the liquid outlet end 132b protrudes into the liquid side 110a through a sidewall of the tank 110 on the liquid side 110a, as shown in FIG. 1.

In some embodiments, an end of the third tube 134 is connected to the sidewall of the case body 120, as shown in FIG. 1. In some other embodiments, the end of the third tube 134 protrudes into the case body 120 through the sidewall of the case body 120.

Figure 2:
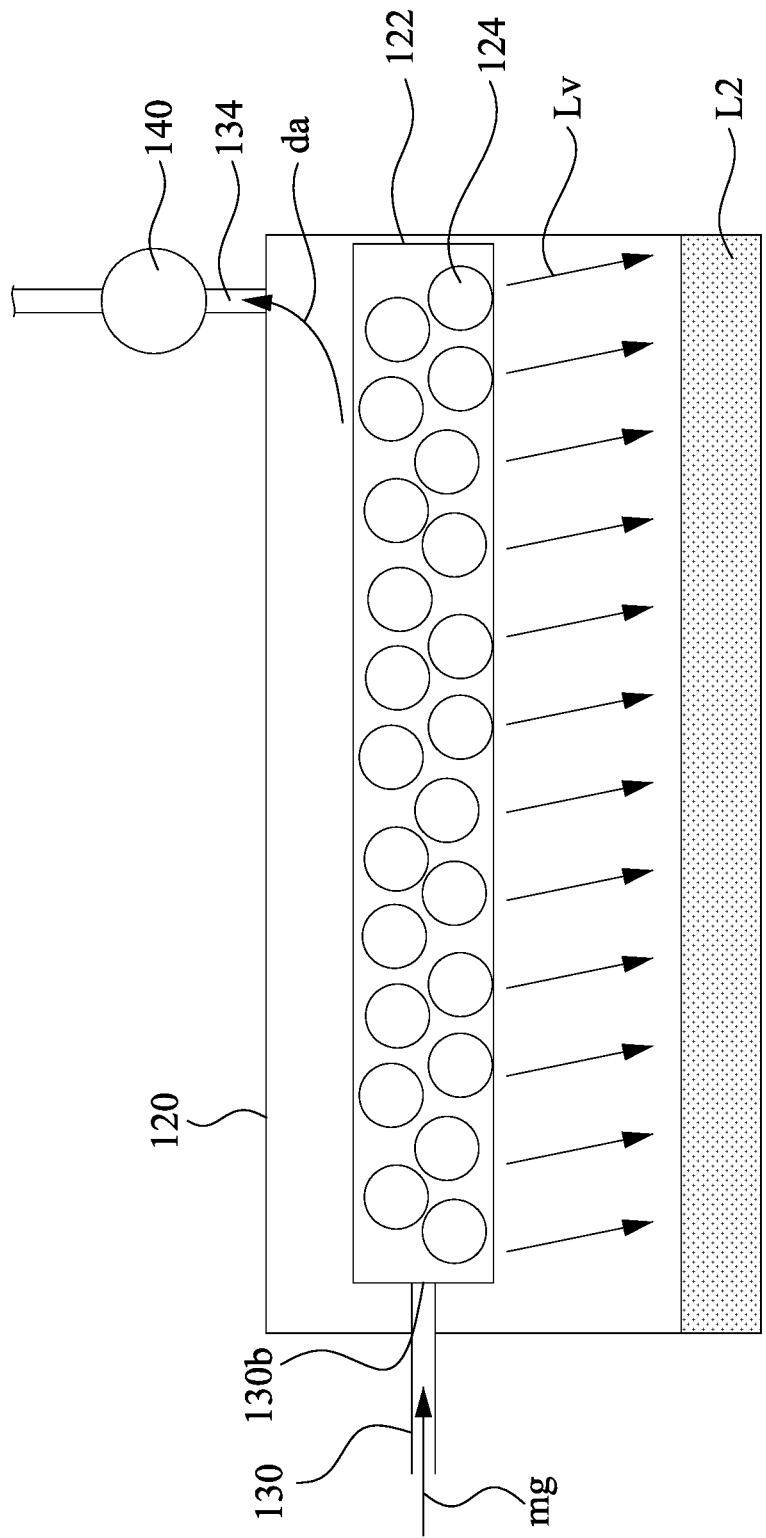
FIG. 2 shows a partial schematic view of gas exhausting of a cooling system of a server, in accordance with an embodiment of present disclosure.

As shown in FIG. 2, the mixed gas mg is composed of a dielectric liquid vapor Lv in the tank 110 and the wet air wa. When the air pressure of the tank 110 is too large so that the mixed gas mg flows from the tank 110 through the first tube 130 to the first dehumidifying material 124 in the multi-hole box 122, because the density of the dielectric liquid vapor Lv is usually greater than that of the dry air da, the concentration of the dry air da above the first dehumidifying material 124 in the case body 120 is greater than the concentration of the dielectric liquid vapor Lv. The concentration of the dry air da below the first dehumidifying material 124 in the case body 120 is lower than the concentration of the dielectric liquid vapor Lv, so that the dry air da that has been dehumidified is exhausted out of the case body 120 through the third tube 134, and the dielectric liquid vapor Lv is stored in the case body 120.

Figure 3:
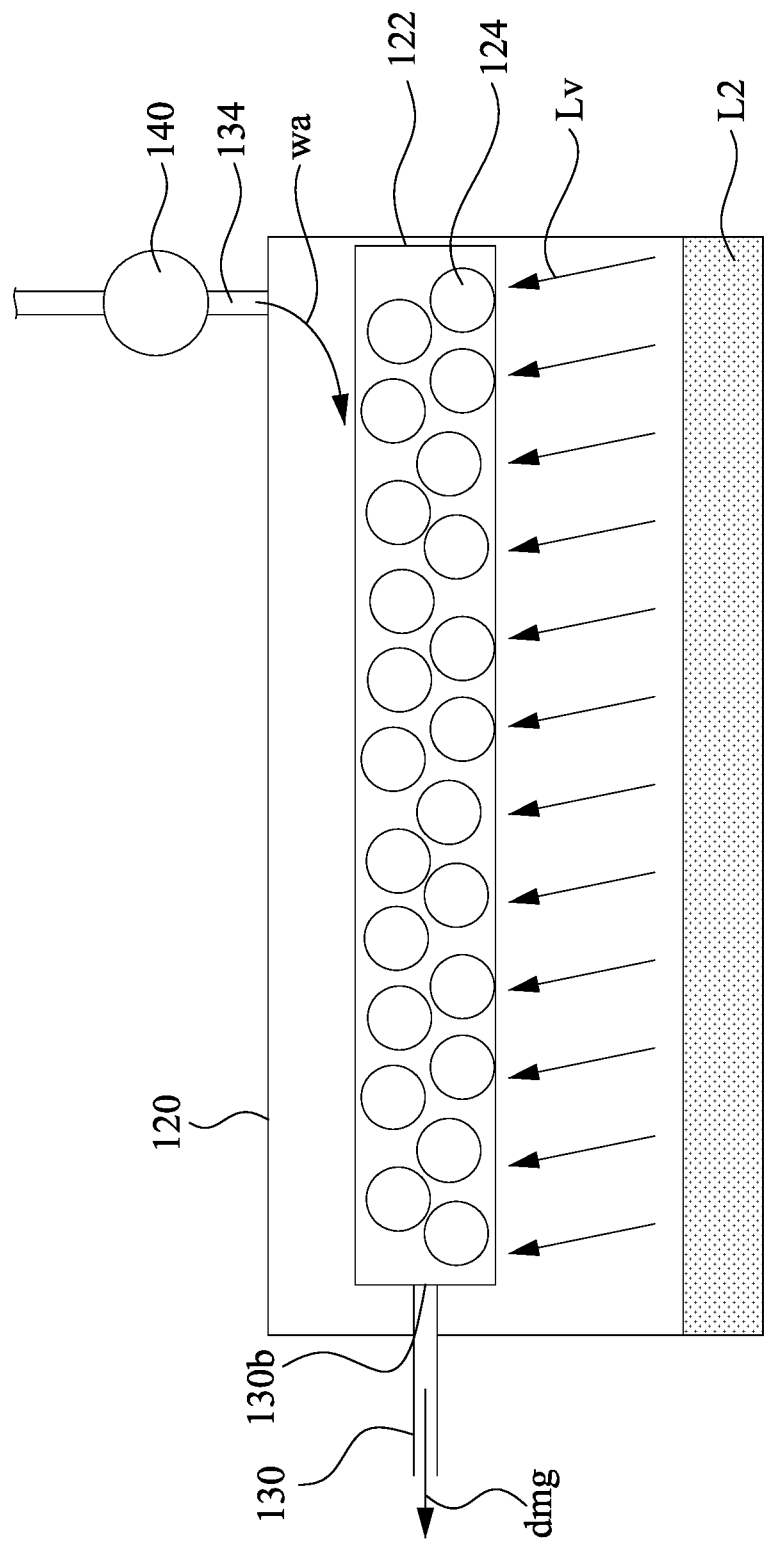
FIG. 3 shows a partial schematic view of gas absorption of a cooling system of a server, in accordance with an embodiment of present disclosure.

As shown in FIG. 3, when the air pressure of the tank 110 is too small, the wet air wa outside the case body 120 will flow into the case body 120 through the third tube 134, and be dehumidified by the first dehumidifying material 124 to become dry air da. The dehumidified dry air da and the dielectric liquid vapor Lv in the case body 120 form a dry mixed gas dmg that flows into the tank 110 through the first tube 130.

In some embodiments, a less part of the wet air wa outside the case body 120 flows into the case body 120 through the third tube 134 and can be condensed into liquid water and stored in the case body 120 without passing through the first dehumidifying material 124. In some embodiments, the condensed liquid L2 is composed of liquid water condensed from the wet air wa outside the case body 120 and the dielectric fluid L1 condensed in the case body 120.

Figure 4:
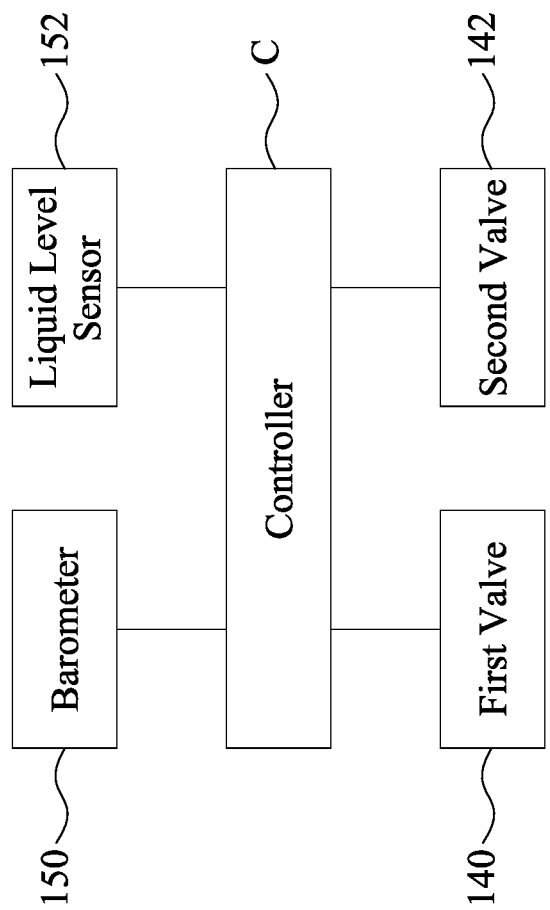
FIG. 4 shows a functional block diagram of some elements of a cooling system of a server, in accordance with an embodiment of present disclosure.

As shown in FIGS. 1 and 4, in this embodiment, the cooling system 100 of the server further includes a barometer 150 and a controller C. The barometer 150 is disposed in the tank 110 and is configured to detect the air pressure value in the tank 110. The controller C is, for example, disposed outside the cooling system 100 of the server to control the opening and closing of a first valve 140 and a second valve 142.

In some embodiments, the first valve 140 and the second valve 142 may be solenoid valves, but the present disclosure is not limited thereto.

Reference is made to FIGS. 1, 2, and 4. In some embodiments, when the barometer 150 detects that the air pressure value of the tank 110 is greater than the upper limit value of air pressure, the barometer 150 will send a signal to a controller C, the controller C will subsequently control the first valve 140 to open, so that the mixed gas mg in the tank 110 flows from the first gas-inlet/outlet end 130a into the first dehumidifying material 124 through the first tube 130, and then is exhausted out of the case body 120 through the third tube 134.

Reference is made to FIGS. 1 and 4. In some embodiments, when the barometer 150 detects that the air pressure value of the tank 110 is lower than the upper limit value of air pressure, the barometer 150 will send a signal to the controller C, the controller C will subsequently control the first valve 140 to close, so that the gas in the tank 110 and the case body 120 cannot be exhausted out of the case body 120 through the third tube 134.

Reference is made to FIGS. 1, 3, and 4. In some embodiments, when the barometer 150 detects that the pressure of the tank 110 is lower than the lower limit of the pressure, the barometer 150 will send a signal to the controller C, the controller C will subsequently control the first valve 140 to open, so that the wet air wa outside the case body 120 flows into the case body 120 through the third tube 134, passes through the first dehumidifying material 124 and then enters the second gas-inlet/outlet end 130b flows into the tank 110 through the first tube 130.

Reference is made to FIGS. 1 and 4. In some embodiments, the cooling system 100 of the server further includes a liquid level sensor 152. The liquid level sensor 152 is disposed in the case body 120 and configured to detect the liquid level of the condensed liquid L2 in the case body 120. When the liquid level sensor 152 detects that the liquid level of the condensed liquid L2 is higher than a preset value, the liquid level sensor 152 will send a signal to the controller C, and the controller C will subsequently control the second valve 142 to open, so that the condensed liquid L2 in the case body 120 flows into the second tube 132 from the liquid inlet end 132a. When passing through the second dehumidifying material 126, the liquid water in the condensed liquid L2 is absorbed, and the residue dielectric liquid L1 flows into the tank 110 from the liquid outlet end 132b through the second tube 132. When the liquid level sensor 152 detects that the liquid level of the condensed liquid L2 is lower than the preset value, the liquid level sensor 152 will send a signal to the controller C, and the controller C will subsequently control the second valve 142 to close. By this way, it can be ensured that only the condensed liquid L2 flows into the tank 110 from the case body 120 through the second tube 132.

In some embodiments, the second valve 142 and the second dehumidifying material 126 may be disposed adjacent to the liquid inlet end 132a and the liquid outlet end 132b, respectively, so that when the second dehumidifying material 126 needs to be replaced, the replacement can be performed without draining the second tube 132, and the convenience of replacement can be increased.

Reference is made to FIG. 4, in some embodiments, the controller C may be a single control unit to simultaneously control the first valve 140 and the second valve 142. In some other embodiments, the controller C may include multiple control units to control the first valve 140 and the second valve 142, respectively.

From the aforementioned detailed description of the specific embodiments of the present disclosure, it can be clearly seen that in the cooling system of the server of the present disclosure, the hot vapor in the tank caused by waste heat generated by the electronic components immersed in the dielectric fluid and the wet air entering the cooling system of the server from the outside are absorbed water vapor and/or liquid water therein by dehumidifying materials, so as to avoid contact between liquid water and electronic components in the cooling system of the server. Since the air entering and exiting the cooling system of the server is processed by the dehumidifying materials, the cooling system of the server can be effectively maintained in a low humidity condition. In addition, in the cooling system of the server of the present disclosure, the user can control the opening and closing of the valve to achieve the purpose of maintaining the air pressure between the preset upper limit and lower limit and preventing the escape of dielectric fluid, so that it can be effective to keep the air pressure constant and increases the recovery rate of the dielectric fluid.

In an embodiment of the present disclosure, the cooling system of the present disclosure can be applied to a server, which can be used for artificial intelligence (AI) computing, edge computing, or used as a 5G server, cloud server or vehicle networking server.

Although the present disclosure has been disclosed as above in the embodiment manner, it is not intended to limit the present disclosure. Those skilled in the art can make various changes and modifications without departing from the spirit and scope of the present disclosure. Therefore, the scope of the present disclosure shall be subject to the scope of the attached claims.

What is claimed is:

1. A cooling system of a server, comprising:
   a tank configured to accommodate a dielectric liquid;
   a case body;
   a multi-hole box disposed in the case body;
   a first dehumidifying material disposed in the multi-hole box;
   a first tube comprising a first gas-inlet/outlet end and a second gas-inlet/outlet end respectively connected to the tank and the case body, the second gas-inlet/outlet end being connected to the first dehumidifying material; and
   a second tube comprising a liquid inlet end and a liquid outlet end respectively connected to the case body and the tank.

2. The cooling system of the server of claim 1, further comprising:
   a third tube communicating with spaces inside and outside the case body; and
   a first valve disposed on the third tube.

3. The cooling system of the server of claim 2, further comprising:
   a barometer configured to detect an air pressure value in the tank; and
   a controller configured to open the first valve when the air pressure value is greater than an upper limit value of air pressure, and configured to close the first valve when the air pressure value is lower than the upper limit value of air pressure.

4. The cooling system of the server of claim 3, wherein the controller is further configured to open the first valve when the air pressure value is lower than an lower limit value of air pressure.

5. The cooling system of the server of claim 2, wherein the liquid inlet end and an end of the third tube connected to the case body are respectively located on opposite sides of the first dehumidifying material.

6. The cooling system of the server of claim 1, further comprising:
   a second valve disposed on the second tube.

7. The cooling system of the server of claim 6, further comprising:
   a liquid level sensor configured to detect a liquid level of a condensed liquid in the case body; and
   a controller configured to respectively open and close the second valve when the liquid level is higher than and lower than a preset value.

8. The cooling system of the server of claim 1, further comprising a second dehumidifying material disposed in the second tube.

9. The cooling system of the server of claim 8, further comprising:
   a second valve disposed on the second tube, wherein the second valve and the second dehumidifying material are respectively adjacent to the liquid inlet end and the liquid outlet end.

10. The cooling system of the server of claim 1, wherein the tank has a liquid side and a gas side opposite to each other, and the liquid outlet end and the first gas-inlet/outlet end are respectively adjacent to the liquid side and the gas side.

* * * * *